(12) United States Patent
Kazama et al.

(10) Patent No.: US 8,378,705 B2
(45) Date of Patent: Feb. 19, 2013

(54) WIRING SUBSTRATE AND PROBE CARD

(75) Inventors: Toshio Kazama, Nagano (JP); Hiroshi Nakayama, Nagano (JP); Shinya Miyaji, Kanagawa (JP); Kohei Suzuki, Yokohama (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 0 days.

(21) Appl. No.: 12/735,929

(22) PCT Filed: Feb. 26, 2009

(86) PCT No.: PCT/JP2009/053602
§ 371 (c)(1),
(2), (4) Date: Aug. 26, 2010

(87) PCT Pub. No.: WO2009/107747
PCT Pub. Date: Sep. 3, 2009

(65) Prior Publication Data
US 2010/0327897 A1   Dec. 30, 2010

(30) Foreign Application Priority Data

Feb. 29, 2008   (JP) .................................. 2008-050888

(51) Int. Cl.
*G01R 31/00* (2006.01)
(52) U.S. Cl. ......... 324/756.03; 324/754.07; 324/750.26; 174/255; 174/256
(58) Field of Classification Search .......... 324/754–765, 324/755.06, 755.04, 755.07, 756.03
See application file for complete search history.

(56) References Cited

U.S. PATENT DOCUMENTS

| 5,945,834 | A  | * | 8/1999 | Nakata et al. | 324/750.05 |
| 5,982,183 | A  | * | 11/1999 | Sano | 324/750.05 |
| 6,610,934 | B2 | * | 8/2003 | Yamaguchi et al. | 174/264 |
| 6,693,029 | B2 | * | 2/2004 | Iijima et al. | 438/622 |
| 6,765,400 | B2 | * | 7/2004 | Ido | 324/756.03 |

(Continued)

FOREIGN PATENT DOCUMENTS

| JP | 11-260871 A | 9/1999 |
| JP | 2001-208773 A | 8/2001 |

(Continued)

OTHER PUBLICATIONS

International Search Report dated May 19, 2009, issued in PCT/JP2009/053602.

(Continued)

*Primary Examiner* — Richard Isla Rodas
(74) *Attorney, Agent, or Firm* — Edwards Wildman Palmer LLP

(57) ABSTRACT

A wiring substrate that allows wiring at a fine pitch and has a coefficient of thermal expansion close to the coefficient of thermal expansion of silicone, and a probe card that includes the wiring substrate are provided. To this end, there are provided a wiring substrate that includes a ceramic substrate having a coefficient of thermal expansion of $3 \times 10^{-6}$ to $5 \times 10^{-6}$/°C. and one or more thin-film wiring sheets stacked on one surface of the ceramic substrate, and a probe head on which a plurality of conductive proves are arranged in accordance with wiring on the thin-film wiring sheet, which holds individual probes while preventing the probes from coming off and allowing both ends of each probe to be exposed, and which is stacked on the wiring substrate while one end of each probe is brought into contact with the thin-film wiring sheet.

4 Claims, 16 Drawing Sheets

U.S. PATENT DOCUMENTS

| | | | |
|---|---|---|---|
| 6,831,455 B2 * | 12/2004 | Yonezawa | 324/756.03 |
| 7,102,085 B2 * | 9/2006 | Ohta et al. | 174/260 |
| 7,285,968 B2 * | 10/2007 | Eldridge et al. | 324/750.03 |
| 7,423,439 B2 | 9/2008 | Kasukabe et al. | |
| 7,482,821 B2 * | 1/2009 | Ishikawa et al. | 324/754 |
| 7,504,843 B2 * | 3/2009 | Fukami | 324/754 |
| 7,719,296 B2 * | 5/2010 | Amemiya et al. | 324/756.03 |
| 7,800,384 B2 * | 9/2010 | Fukami | 324/754.08 |
| 7,898,272 B2 | 3/2011 | Sasaki et al. | |
| 2003/0006788 A1 | 1/2003 | Ido | |
| 2004/0207419 A1 | 10/2004 | Ido | |
| 2004/0207425 A1 | 10/2004 | Ido | |
| 2007/0069743 A1 * | 3/2007 | Inoue et al. | 324/754 |
| 2007/0103178 A1 | 5/2007 | Kasukabe et al. | |
| 2007/0178727 A1 * | 8/2007 | Igarashi et al. | 439/91 |
| 2007/0205783 A1 * | 9/2007 | Sato et al. | 324/754 |
| 2009/0219042 A1 | 9/2009 | Sasaki et al. | |

FOREIGN PATENT DOCUMENTS

| | | |
|---|---|---|
| JP | 2001-524258 | 11/2001 |
| JP | 2002-071712 A | 3/2002 |
| JP | 2002076074 A | 3/2002 |
| JP | 3386077 | 1/2003 |
| JP | 2005-164600 A | 6/2005 |
| JP | 2007-064850 A | 3/2007 |
| KR | 1020070038410 | 4/2007 |
| WO | WO-96/15458 A1 | 5/1996 |
| WO | WO-96/38858 A2 | 12/1996 |
| WO | WO-2007142204 A1 | 12/2007 |

OTHER PUBLICATIONS

Taiwanese Office Action for Patent Application No. 98106347 issued Aug. 20, 2012.

Japanese Office Action for Japanese Patent Application 2010-500750 mailed Oct. 2, 2012.

Decision to Grant a Patent received for Korean Patent Application No. 10-2010-7019053 issued on Dec. 6, 2012.

* cited by examiner

WIRING SUBSTRATE AND PROBE CARD

TECHNICAL FIELD

The present invention relates to a wiring substrate and a probe card that includes the wiring substrate and that is used for an electrical characteristics test for a semiconductor wafer.

BACKGROUND ART

In a semiconductor test process, an electrical characteristics test for detecting a defective product is performed by bringing probes having conductivity into contact with a semiconductor wafer before dicing (wafer level test). When the wafer level test is performed, to transfer a test signal to the semiconductor wafer, a probe card housing a large number of probes is used. In the wafer level test, the probes are individually brought into contact with each of dies on the semiconductor wafer while the dies are scanned by the probe card. Because hundreds to tens of thousands of dies are formed on the semiconductor wafer, it takes considerable time to test one semiconductor wafer. Thus, an increase in the number of dies causes higher cost.

To solve the problems of the wafer level test described above, in recent years, a method (full wafer level test) is also used in which hundreds to tens of thousands of probes are collectively brought into contact with all or at least about ¼ to ½ of dies on a semiconductor wafer (see, for example, Patent Document 1). In this method, to accurately bring the probes into contact with electrodes on the semiconductor wafer, there are proposed a technology for maintaining positional accuracy of tips of probes by accurately keeping the parallelism or the flatness of a probe card with respect to a surface of the semiconductor wafer and a technology for highly accurately aligning a semiconductor wafer (see, for example, Patent Document 2 or 3).

FIG. 16 is a diagram schematically illustrating a configuration example of a probe card applied to the wafer level test described above. A probe card 401 illustrated in the figure includes a probe head 403 that houses a plurality of probes 402 arranged in accordance with an arrangement pattern of electrodes on a semiconductor wafer, a space transformer 404 that transforms a pitch of a fine wiring pattern on the prove head 403, an interposer 405 that relays wiring w put out from the space transformer 404, a leaf spring 406 that holds the probe head, a wiring substrate 407 that connects the wiring w relayed by the interposer 405 to a test apparatus, a connector 408 that is arranged on the wiring substrate 407 and is connected to the test apparatus side that generates a test signal, and a reinforcing member 409 that reinforces the wiring substrate 407.

Patent Document 1: Japanese Patent Application Publication No. 2001-524258
Patent Document 2: Japanese Patent No. 3386077
Patent Document 3: Japanese Laid-open Patent Publication No. 2005-164600

DISCLOSURE OF INVENTION

Problem to be Solved by the Invention

In general, the coefficient of thermal expansion ($3.4 \times 10^{-6}/°$ C.) of a semiconductor wafer composed mostly of silicone is significantly smaller than the coefficient of thermal expansion ($12 \times 10^{-6}$ to $17 \times 10^{-6}/°$ C.) of a wiring substrate composed mostly of resin such as glass epoxy or polyimide. Therefore, in the conventional probe card, the space transformer is formed of material having a coefficient of thermal expansion that is larger than the coefficient of thermal expansion of the semiconductor wafer and is smaller than the coefficient of thermal expansion of the wiring substrate in order to alleviate a difference between the coefficient of thermal expansion of the semiconductor wafer and the coefficient of thermal expansion of the wiring substrate, and to prevent misalignment between a tip position of a probe and an electrode of the semiconductor wafer when an electrical characteristics test is performed under a wide temperature environment (about 25 to 125° C.).

Because the space transformer requires inner wiring, it takes time to manufacture the space transformer, and, because a number of layers need to be stacked, cost is increased inevitably. In this circumstance, a demand is growing for a wiring substrate that allows wiring at a fine pitch of about 100 µm and has a coefficient of thermal expansion close to the coefficient of thermal expansion of silicone, as a wiring substrate that allows construction of a probe card without using the space transformer.

The present invention has been made in view of the above, and it is an object of the present invention to provide a wiring substrate that allows wiring at a fine pitch and has a coefficient of thermal expansion close to the coefficient of thermal expansion of silicone, and a probe card that includes the wiring substrate.

Means for Solving Problem

To solve the problem described above and achieve the object, a wiring substrate according to the present invention includes: a ceramic substrate having a coefficient of thermal expansion of $3.0 \times 10^{-6}$ to $5.0 \times 10^{-6}/°$ C.; and one or more thin-film wiring sheets stacked on one surface of the ceramic substrate.

In the wiring substrate according to the present invention as set forth in the invention described above, the ceramic substrate has a through hole that pierces through the ceramic substrate in a thickness direction.

In the wiring substrate according to the present invention as set forth in the invention described above, a plurality of zero insertion force type connectors, each of which is electrically connected to the thin-film wiring sheet, is further included.

In the wiring substrate according to the present invention as set forth in the invention described above, one or more metals that are stacked on other surface of the ceramic substrate and that have coefficients of thermal expansion smaller than the coefficient of thermal expansion of the ceramic substrate is further included.

In the wiring substrate according to the present invention as set forth in the invention described above, a thin-film multilayer wiring sheet stacked on other surface of the ceramic substrate is further included.

A probe card according to the present invention that electrically connects a semiconductor wafer and a circuit structure that generates a signal to be output to the semiconductor wafer, by using a conductive probe that is extendable in a longitudinal direction, includes: the wiring substrate according to any one of the invention as set forth; and a probe head on which a plurality of probes is arranged in accordance with wiring on the thin-film wiring sheet, which holds individual probes while preventing the probes from coming off and allowing both ends of each probe to be exposed, and which is stacked on the wiring substrate while allowing one end of each probe to be brought into contact with the thin-film wiring sheet.

EFFECT OF THE INVENTION

According to the present invention, because a ceramic substrate having the coefficient of thermal expansion of $3.0 \times 10^{-6}$ to $5.0 \times 10^{-6}/°$ C. and one or more thin-film wiring sheets stacked on one surface of the ceramic substrate are provided, it is possible to provide a wiring substrate that allows wiring at a fine pitch and has a coefficient of thermal expansion close to the coefficient of thermal expansion of silicone, and a probe card that includes the wiring substrate.

EXPLANATIONS OF LETTERS OR NUMERALS

- 1, 8, 12, 15, 401 Probe card
- 2, 402 Probe
- 3, 403 Probe head
- 4, 4', 9, 13, 16, 18, 19, 44, 407 Wiring substrate
- 5, 406 Leaf spring
- 6, 10, 14, 17, 408 Connector
- 7, 409 Reinforcing member
- 11 Mounted component
- 14a Joint portion
- 14b First flange portion
- 14c Body portion
- 14d Second flange portion
- 21, 22 Plunger
- 21a, 22a Tip portion
- 21b, 22c Boss portion
- 21c Shaft portion
- 22b Flange portion
- 23 Coil spring
- 23a Loosely wound portion
- 23b Tightly wound portion
- 31, 134, 142, 143, 164, 175, 176 Hole portion
- 31a Small diameter hole
- 31b Large diameter hole
- 41, 91, 131, 161, 181, 191 Ceramic substrate
- 42a, 42b, 42c, 42d, 92a, 92b, 92c, 132a, 132b, 132c, 132d, 162, 182a, 182b, 182c, 182d, 192a, 192b, 192c, 192d Thin-film wiring sheet
- 43, 43', 46 Thin-film multilayer wiring sheet
- 93 Resin substrate
- 100 Semiconductor wafer
- 101 Electrode
- 133 Cutout part
- 141, 173, 174 Lead wire
- 163 Opening portion
- 171 First connector
- 171a First joint portion
- 171b Third flange portion
- 171c Second joint portion
- 172 Second connector
- 172a Fourth flange portion
- 172b Engagement portion
- 183, 193, 194, 195 Metal
- 201, 301 Screw
- 404 Space transformer
- 405 Interposer
- 411, 431, 911, 931 Through hole
- 412, 912, 932 Conductive material

BEST MODE(S) FOR CARRYING OUT THE INVENTION

Best modes for carrying out the present invention (hereinafter, "embodiments") are explained below with reference to the accompanying drawings. It should be noted that the drawings are schematic and a relation between the thickness and the width of each portion, a ratio of the thicknesses of the respective portions, and the like may be different from realistic ones. It goes without saying that the drawings may depict some portion as having different relations and ratios of dimensions.

First Embodiment

Figure 1:
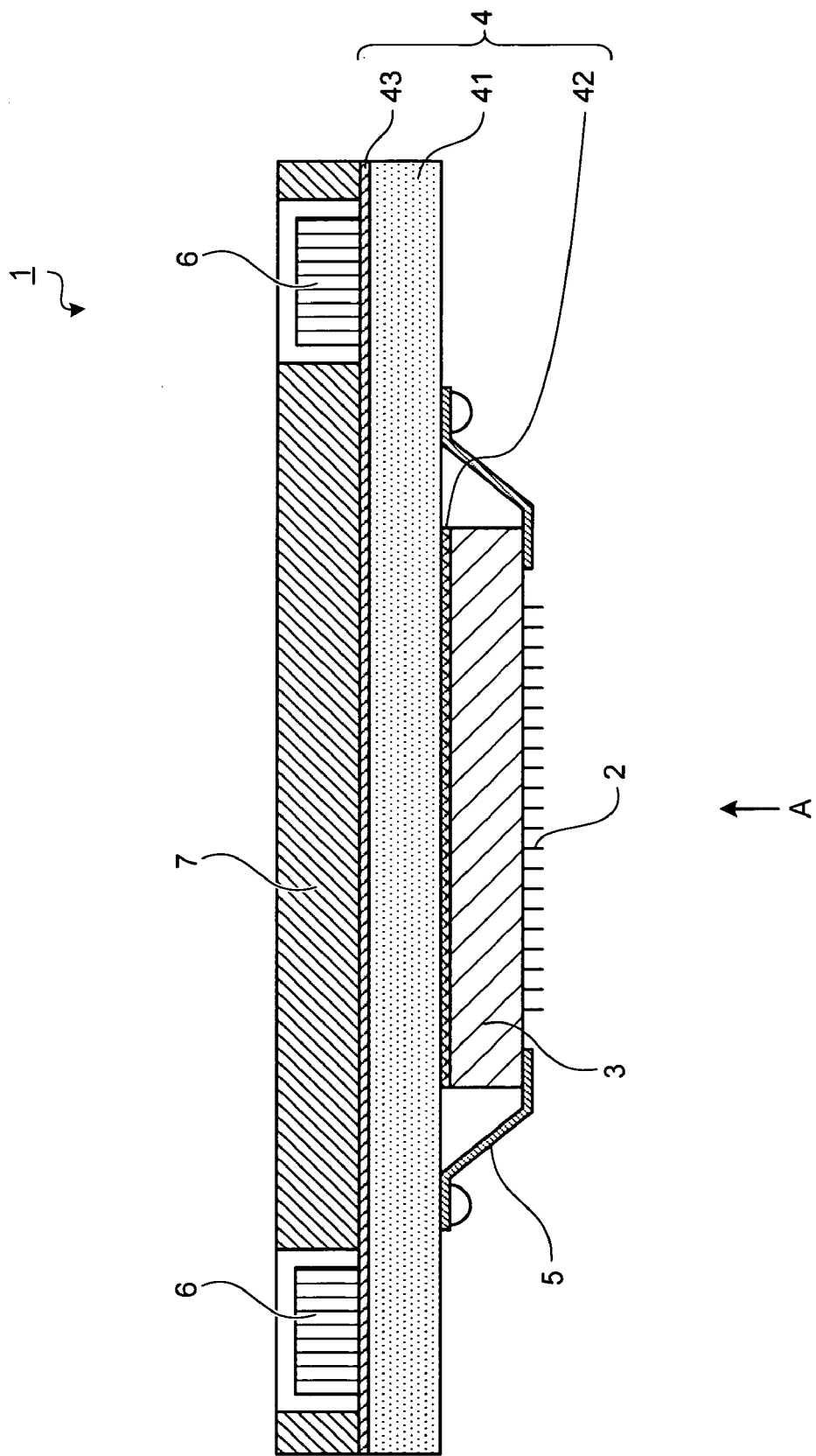
FIG. 1 is a diagram of a configuration of a probe card according to a first embodiment of the present invention.
Figure 2:
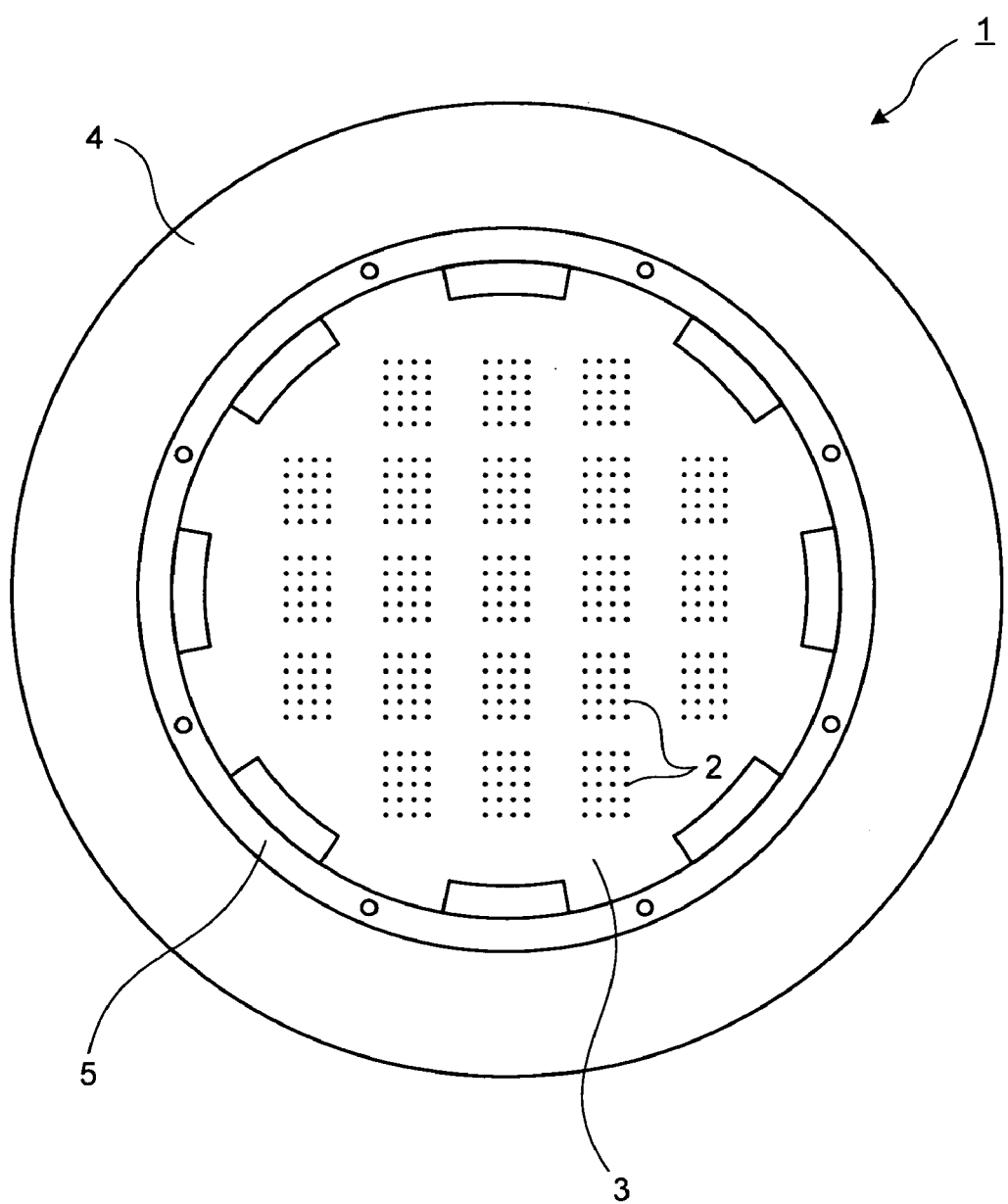
FIG. 2 is a plan view taken in a direction of an arrow A of FIG. 1.

FIG. 1 is a diagram of a configuration of a probe card according to a first embodiment of the present invention. FIG. 2 is a plan view taken in a direction of an arrow A of FIG. 1. A probe card 1 illustrated in the figures includes a plurality of conductive probes 2 arranged in accordance with a test object, a probe head 3 which is formed in a disk-shape and houses the plurality of probes 2, a wiring substrate 4 which has a wiring pattern corresponding to an arrangement pattern of the probes housed in the probe head 3 and is formed in a disk-shape with a diameter larger than the diameter of the probe head 3, a leaf spring 5 which is fixed to the wiring substrate 4 and holds the probe head 3, a connector 6 which is formed on a surface on the opposite side of a surface where the probe head 3 is stacked among the surfaces of the wiring substrate 4 and which makes a connection with a test apparatus that includes a circuit structure for generating a test signal, and a reinforcing member 7 which is mounted on one surface of the wiring substrate 4 and reinforces the wiring substrate 4 to prevent the wiring substrate 4 from being deformed.

Figure 3:
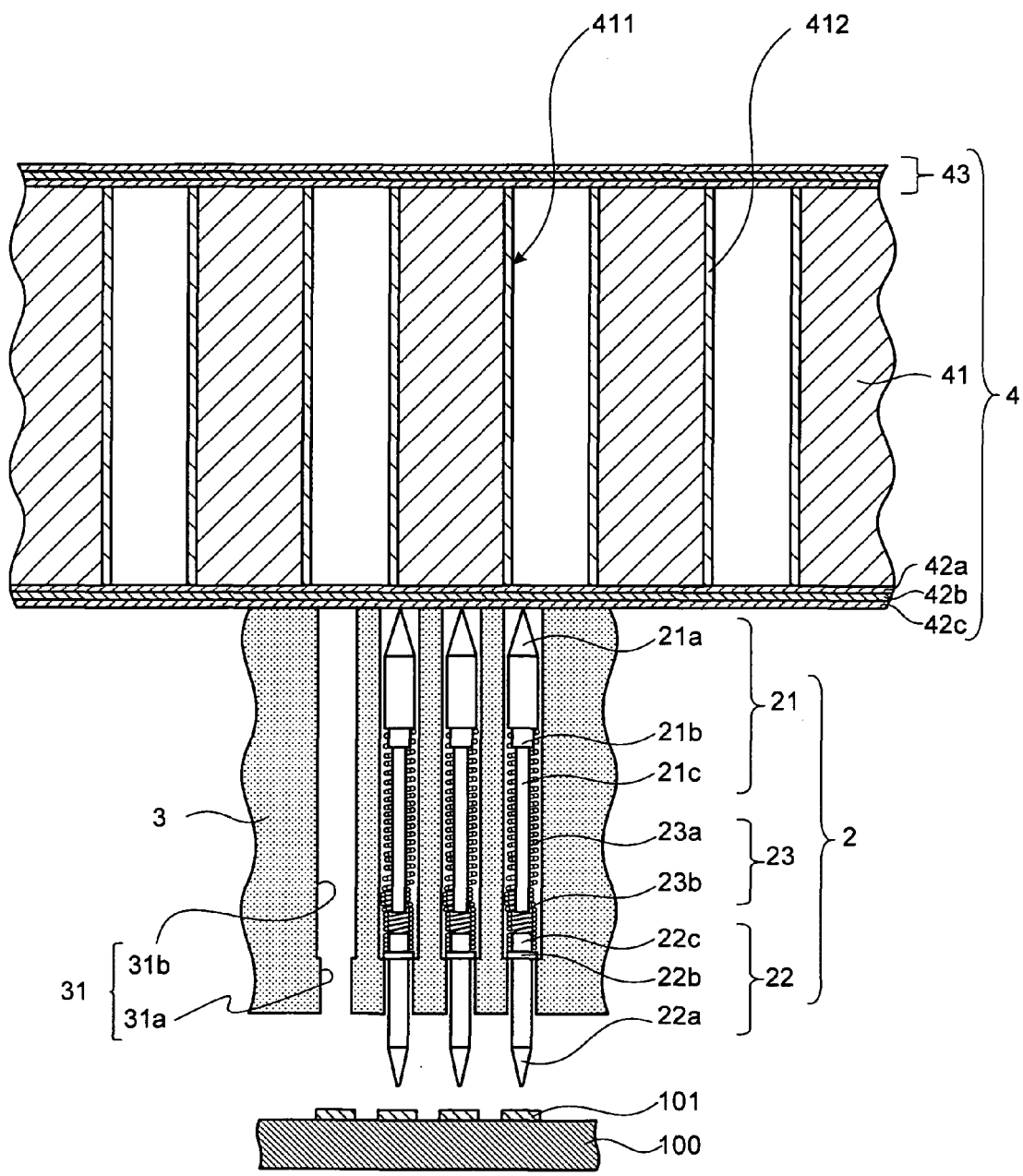
FIG. 3 is a diagram of each relevant portion of a probe, a probe head, and a wiring substrate.

FIG. 3 is a diagram of a configuration of the probe 2 and configurations of relevant portions of the probe head 3 and the wiring substrate 4. The probe 2 includes a plunger 21 of which tip is brought into contact with the wiring substrate 4, a plunger 22 which protrudes in a direction opposite to the plunger 21 and is brought into contact with an electrode 101 of a semiconductor wafer 100 being a test object, and a coil spring 23 which is arranged between the plungers 21 and 22 and couples the plungers 21 and 22 in an extendable manner. The plungers 21 and 22 being coupled with each other and the coil spring 23 have the same axis lines.

The plunger 21 includes a tip portion 21a having a sharp tip end, a boss portion 21b which is formed on a base end side of the tip portion 21a and has a diameter smaller than the diameter of the tip portion 21a, and a shaft portion 21c which extends from a surface on the opposite side of a surface that comes into contact with the tip portion 21a among the surfaces of the boss portion 21b. The plunger 22 includes a tip portion 22a having a sharp tip end, a flange portion 22b which is formed on a base end side of the tip portion 22a and has a diameter larger than the diameter of the tip portion 22a, and a boss portion 22c which protrudes from the surface of the flange portion 22b in a direction opposite to the tip portion 22a and has a diameter smaller than the diameter of the flange portion 22b. The coil spring 23 is structured such that one side attached to the plunger 21 is a loosely wound portion 23a, and the other side attached to the plunger 22 is a tightly wound portion 23b. The end portion of the loosely wound portion 23a is press fitted onto the boss portion 21b, while the end portion of the tightly wound portion 23b is press fitted onto the boss portion 22c.

In the probe 2 in the state illustrated in FIG. 3, the coil spring 23 is curved so that at least a portion of the tightly wound portion 23b is brought into contact with the shaft portion 21c. Therefore, when the tip portion 22a of the plunger 22 is brought into contact with the electrode 101 of the semiconductor wafer 100, an electrical connection is established with the shortest path via the plunger 21, the tightly wound portion 23b of the coil spring 23, and the plunger 22 in sequence.

The configuration of the probe 2 described above is just an example, and any of various types of conventionally-known probes may be used in the configuration.

The probe head 3 is formed by using insulating material. On the probe head 3, hole portions 31 that individually house the probes 2 are arranged in accordance with an array of the electrodes 101 of the semiconductor wafer 100 such that the hole portions 31 pierce through the probe head 3 in a thickness direction (a vertical direction of FIG. 3). Each hole portion 31 includes a small diameter hole 31a formed from the end surface on the semiconductor wafer 100 side along the length shorter than at least the length of the tip portion 22a in the longitudinal direction, and a large diameter hole 31b having the same central axis as the small diameter hole 31a and a diameter larger than the diameter of the small diameter hole 31a. The inner diameter of the small diameter hole 31a is slightly larger than the outer diameter of the tip portion 22a and is slightly smaller than the outer diameter of the flange portion 22b. Therefore, the hole portion 31 prevents the plunger 22 from coming off.

The number and an arrangement pattern of the probes 2 housed in the probe head 3 are determined depending on the number of semiconductor chips and an arrangement pattern of the electrodes 101 formed on the semiconductor wafer 100. For example, when the semiconductor wafer 100 having a diameter of 8 inches (about 200 millimeters) is the test object, tens to thousands of the probes 2 are necessary. When the semiconductor wafer having a diameter of 12 inches (about 300 millimeters) is the test object, hundreds to tens of thousands of the probes 2 are necessary.

The wiring substrate 4 includes a ceramic substrate 41 having the coefficient of thermal expansion of $2.5 \times 10^{-6}$ to $5.0 \times 10^{-6}/°$ C., or more preferably, $2.9 \times 10^{-6}$ to $3.9 \times 10^{-6}/°$ C., three thin-film wiring sheets 42a, 42b, 42c stacked on one surface of the ceramic substrate 41, and a thin-film multilayer wiring sheet 43 stacked on the other surface of the ceramic substrate 41. The value of the coefficient of thermal expansion of the ceramic substrate 41 is close to the value of the coefficient of the thermal expansion of silicone ($3.4 \times 10^{-6}/°$ C.). The thin-film wiring sheets 42a, 42b, 42c and the thin-film multilayer wiring sheet 43 are, for example, Cu/PI thin-film multilayer wiring sheets and allow wiring at a fine pitch of about 100 μm. The thin-film wiring sheets 42a, 42b, 42c and the thin-film multilayer wiring sheet 43 are fixed to the ceramic substrate 41 by adhesive bonding or the like. In FIG. 1, the three thin-film wiring sheets 42a, 42b, 42c are collectively denoted by a reference symbol 42.

On the ceramic substrate 41 is formed a plurality of through holes 411 piercing through in a plate thickness direction. The through holes 411 are formed by any of machining methods such as drilling, punching, laser machining, electron beam machining, ion beam machining, wire electrical discharge machining, or etching, and the surfaces thereof are subjected to plating with a conductive material 412 such as silver or copper.

Figure 4:
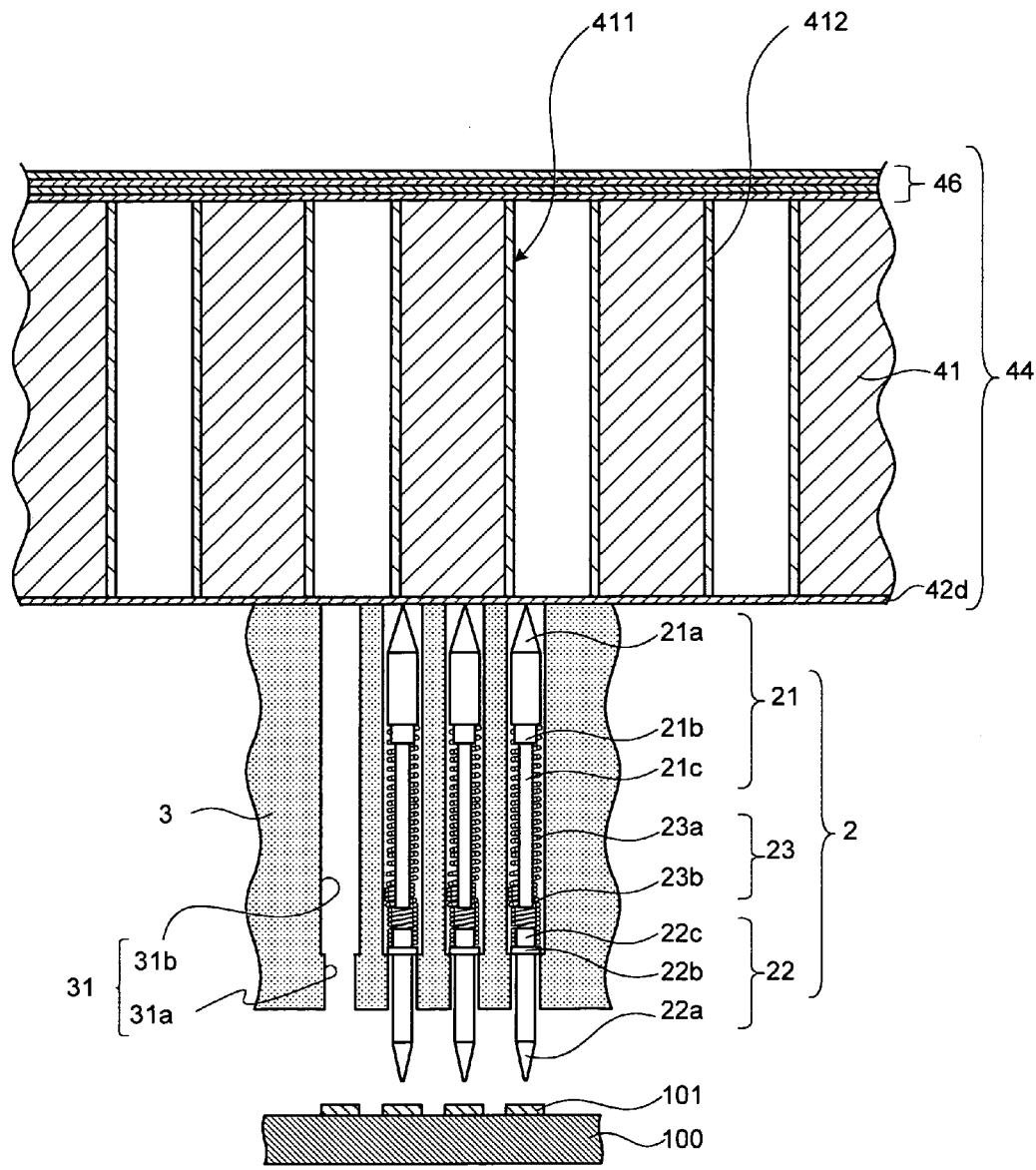
FIG. 4 is a diagram of another configuration example of a relevant portion of the wiring substrate.

As a wiring substrate 44 illustrated in FIG. 4, it is possible to arrange a single thin-film wiring sheet 42d on one surface of the ceramic substrate 41 and arrange a four-layered thin-film multilayer wiring sheet 46 on the other surface of the ceramic substrate 41. In FIG. 1, a case is illustrated in which the surface area of the thin-film wiring sheet 42d is the same as the surface area of the probe head 3. However, it is possible to make the surface area of the thin-film wiring sheet 42d the same as the surface area of the ceramic substrate 41.

According to the first embodiment described above, because the ceramic substrate having the coefficient of thermal expansion of $3.0 \times 10^{-6}$ to $5.0 \times 10^{-6}/°$ C. and one or more thin-film wiring sheets stacked on one surface of the ceramic substrate are included, it is possible to provide a wiring substrate that allows wiring at a fine pitch and has a coefficient of thermal expansion close to the coefficient of thermal expansion of silicone, and a probe card that includes the wiring substrate.

Furthermore, according to the first embodiment, because the coefficient of thermal expansion of the wiring substrate is close to that of the silicone and wiring at a fine pitch is available on the wiring substrate, it is not necessary to use a space transformer, unlike a conventional probe card. Therefore, an interposer that electrically connects the space transformer and the wiring substrate is also not necessary, so that a problem can hardly occur in that electrical characteristics are deteriorated due to increase in contact points as in the conventional probe card. As a result, it is possible to provide a wiring substrate and a probe card having excellent transmission characteristics for a high-frequency electrical signal.

Moreover, according to the first embodiment, because the space transformer and the interposer are not needed, the number of components is decreased, making the assembly easy and making it possible to reduce manufacturing time. Therefore, it is possible to reduce costs for manufacturing, resulting in reduced prices.

Furthermore, according to the first embodiment, the coefficient of thermal expansion of the wiring substrate is made close to the coefficient of thermal expansion of a semiconductor wafer, so that the wiring substrate is prevented from being misaligned or warping at the time of a test. Therefore, it is possible to uniformly bring all probes into contact with the semiconductor wafer, making it possible to prevent a difference in the degree of abrasion between the probes and improve durability of each probe.

Figure 5:
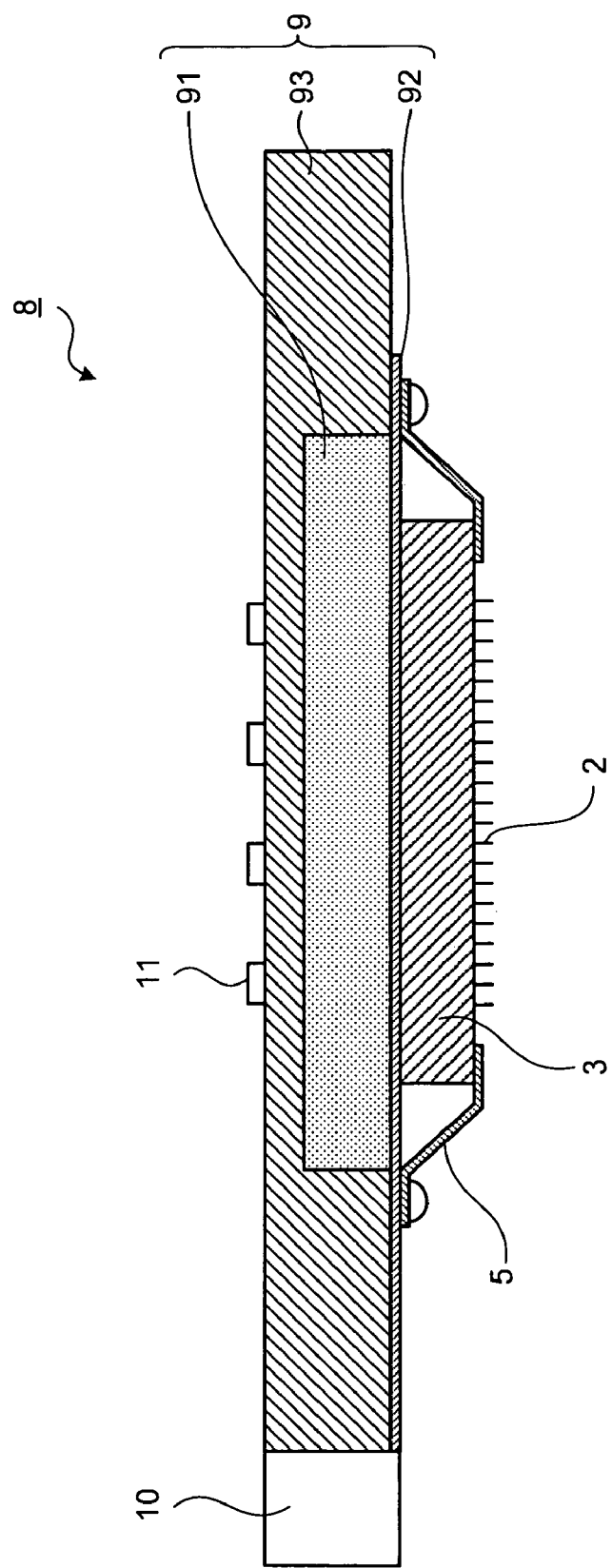
FIG. 5 is a diagram of a configuration of a probe card according to a modified example of the first embodiment.

FIG. 5 is a diagram of a configuration of a probe card according to a modified example of the first embodiment. A probe card 8 illustrated in the figure includes the plurality of probes 2, the probe head 3, a wiring substrate 9, a connector 10 which is arranged on the side surface of the wiring substrate 9 and is used for connecting a test apparatus, and mounted components 11 which are arranged on the surface of the wiring substrate 9 and include a noise reduction capacitor.

The wiring substrate 9 includes a ceramic substrate 91 made of the same material as the ceramic substrate 41 of the first embodiment described above, three thin-film wiring sheets 92a, 92b, 92c which are fixedly stacked on one surface of the ceramic substrate 91 and interposed between the ceramic substrate 91 and the probe head 3, and a resin substrate 93 which is composed mostly of resin such as glass epoxy or polyimide and has a concave portion in which the ceramic substrate 91 is fitted. The resin substrate 93 has a surface which becomes flush with the surface of the ceramic substrate 91 when the ceramic substrate 91 is fitted, and on which the thin-film wiring sheets 92a, 92b, 92c are stacked. In FIG. 5, the three thin-film wiring sheets 92a, 92b, 92c are collectively denoted by a reference symbol 92.

Figure 6:
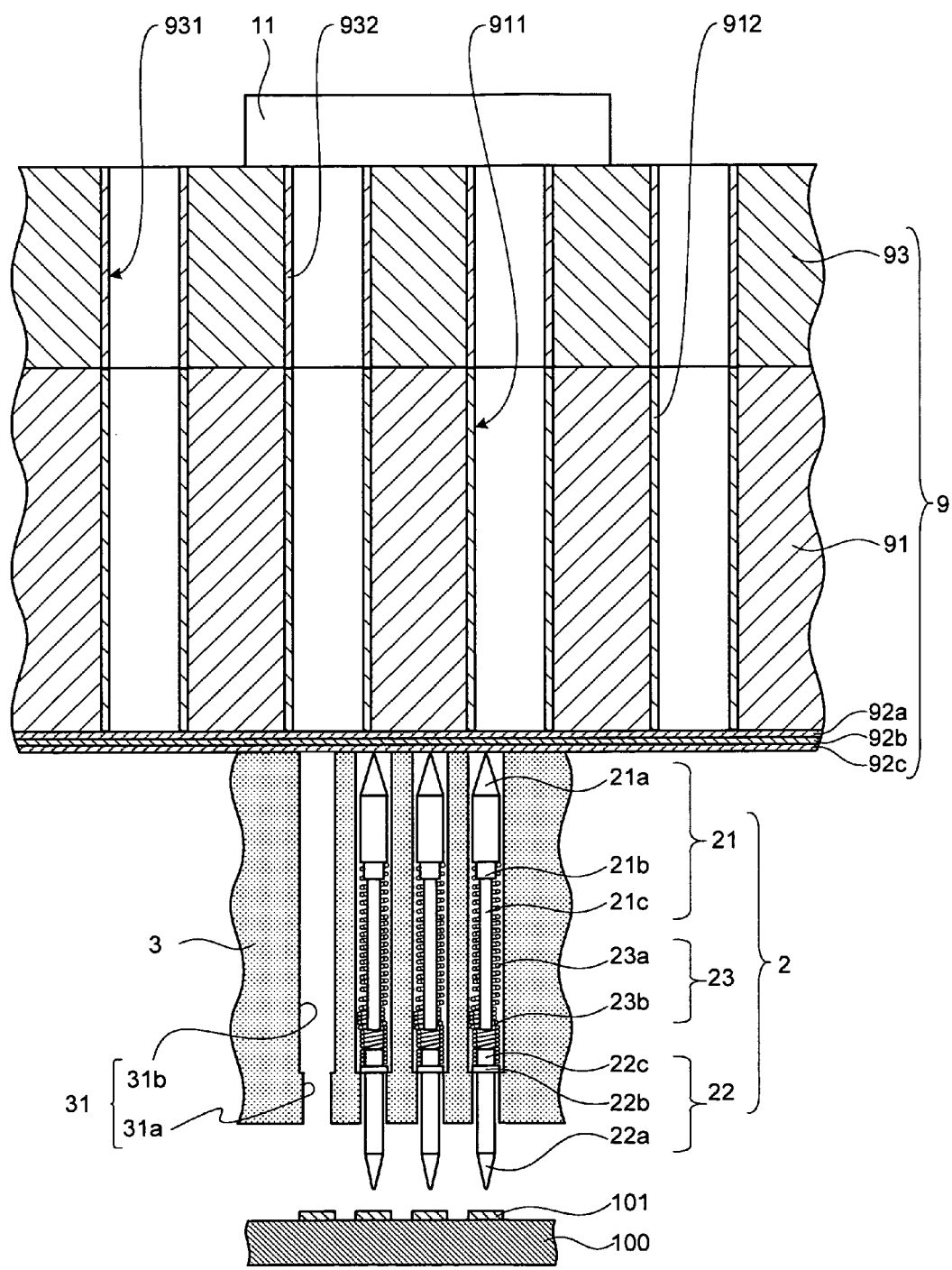
FIG. 6 is a diagram of a configuration of a relevant portion of the probe card according to the modified example of the first embodiment of the present invention.

FIG. 6 is a diagram of a configuration of a relevant portion of the probe card 8. Pluralities of through holes 911 and 931, which form respective pairs and communicate with each other, are formed on the ceramic substrate 91 and the resin substrate 93, respectively. The surfaces of the through holes 911 and 931 are subjected to plating with conductive materials 912 and 931, respectively. The mounted components 11 are electrically connected to the probes 2 via the through holes 911, 931, and the three thin-film wiring sheets 92a, 92b, 92c.

According to the probe card 8 having the above configuration, it is possible to easily adjust the flatness of the ceramic substrate 91 by reducing the volume of the ceramic substrate 91 to the requisite minimum. Furthermore, because the resin substrate 93 which is lower in cost than the ceramic substrate 91 is used as remaining part of the wiring substrate 9, it is possible to further reduce costs.

Figure 7:
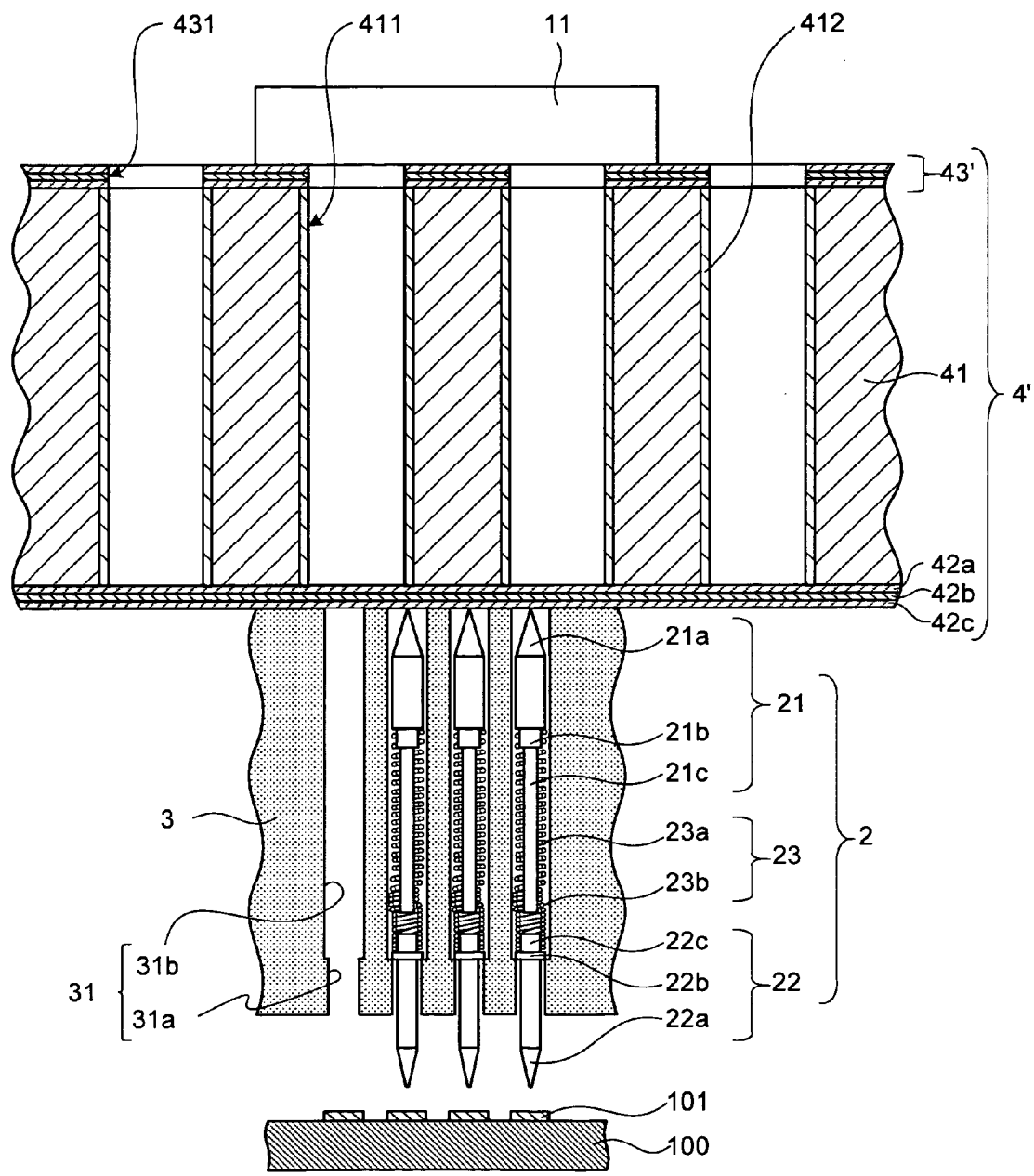
FIG. 7 is a diagram of a configuration of a probe card according to another modified example of the first embodiment of the present invention.

It is possible to mount the mounted component 11 on the probe card 1 described above. FIG. 7 is a diagram of a configuration of such a probe card. A wiring substrate 4' illustrated in the figure includes the ceramic substrate 41, the three thin-film wiring sheets 42a, 42b, 42c, and a thin-film multilayer wiring sheet 43' which is constructed by forming through holes 431 that communicate with the through holes 411 of the ceramic substrate 41 on the thin-film multilayer wiring sheet 43. With use of the wiring substrate 4' having the above configuration, it is possible to realize linear wiring between the mounted component 11 and the probes 2, so that a distance from the semiconductor wafer 100 to the mounted component 11 can be shortened. Therefore, when a noise reduction capacitor for example is mounted as the mounted component 11, good noise reduction effect can be achieved.

Second Embodiment

Figure 8:
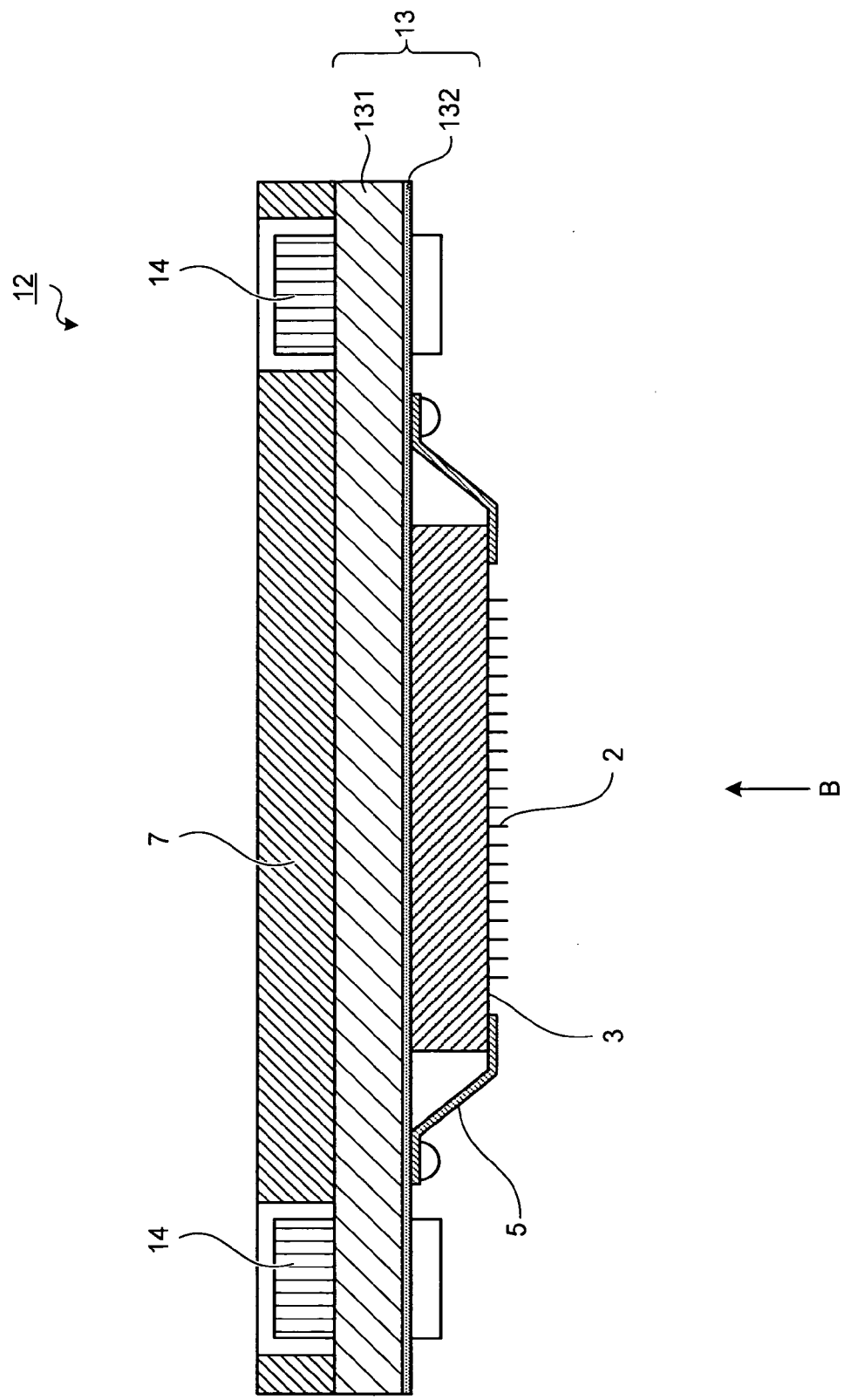
FIG. 8 is a diagram of a configuration of a probe card according to a second embodiment of the present invention.
Figure 9:
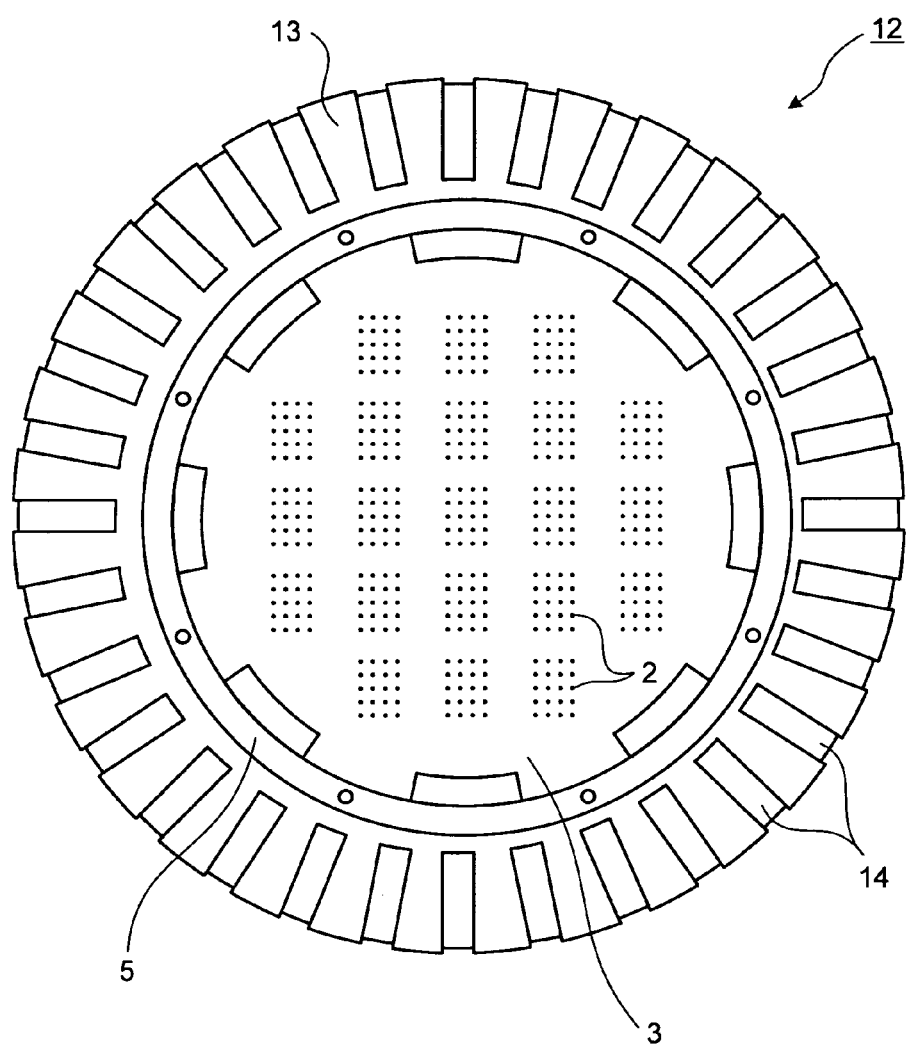
FIG. 9 is a plan view taken in a direction of an arrow B of FIG. 8.
Figure 10:
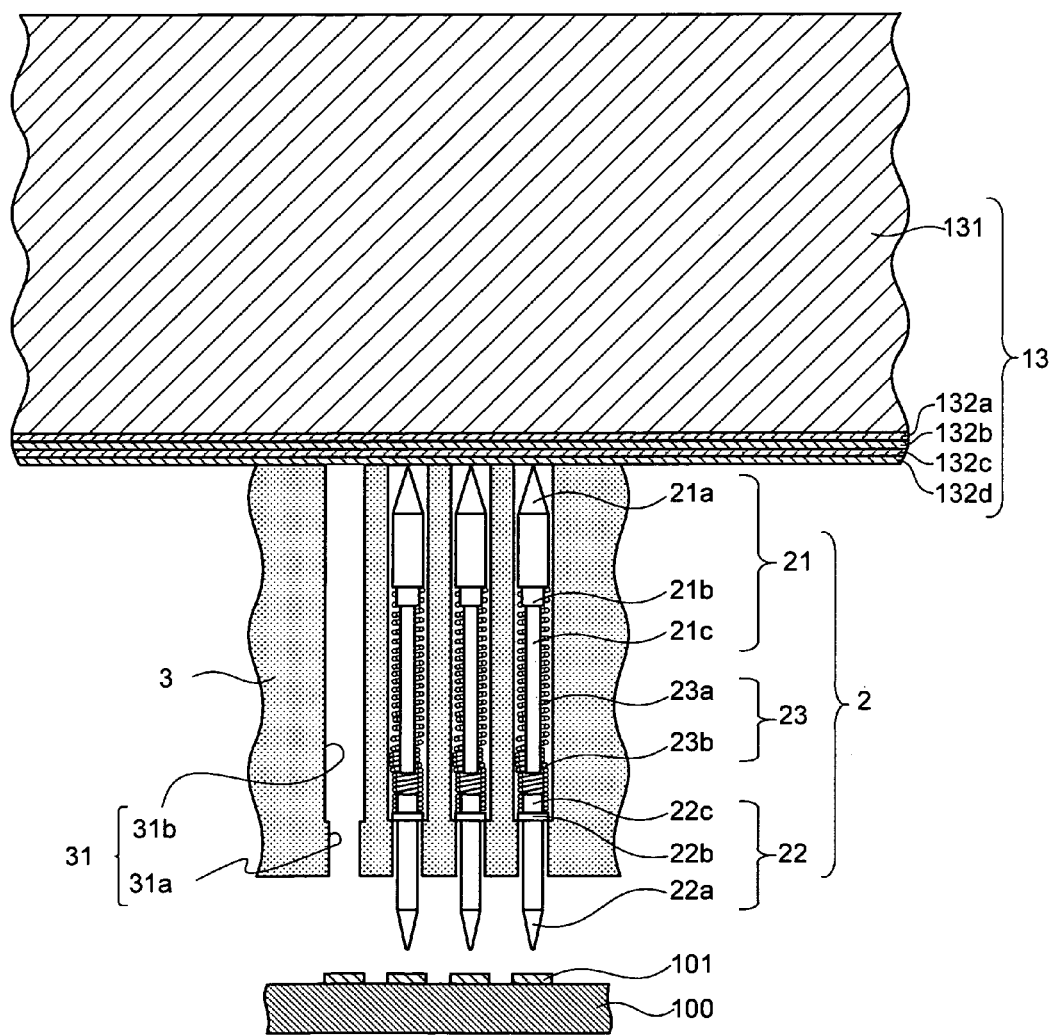
FIG. 10 is a diagram of a configuration of a relevant portion of the probe card according to the second embodiment of the present invention.

FIG. 8 is a diagram of a configuration of a probe card according to a second embodiment of the present invention. FIG. 9 is a plan view taken in a direction of an arrow B of FIG. 8. FIG. 10 is a diagram of a configuration of a relevant portion of the probe card according to the second embodiment. A probe card 12 illustrated in the figures includes the plurality of probes 2, the probe head 3, a wiring substrate 13, the leaf spring 5, the reinforcing member 7, and a plurality of connectors 14 which are radially arranged with respect to the center of the wiring substrate 13 for making a connection with a test apparatus.

The wiring substrate 13 includes a ceramic substrate 131 made of the same material as the ceramic substrate 41 described above (with the coefficient of thermal expansion of $2.5 \times 10^{-6}$ to $5.0 \times 10^{-6}/°$ C., or more preferably, $2.9 \times 10^{-6}$ to $3.9 \times 10^{-6}/°$ C.), and four thin-film wiring sheets 132a, 132b, 132c, 132d which are fixedly stacked on one surface of the ceramic substrate 131 on a side opposing the probe head 3. In FIG. 8, the four thin-film wiring sheets 132a, 132b, 132c, 132d are collectively denoted by a reference symbol 132.

Figure 11:
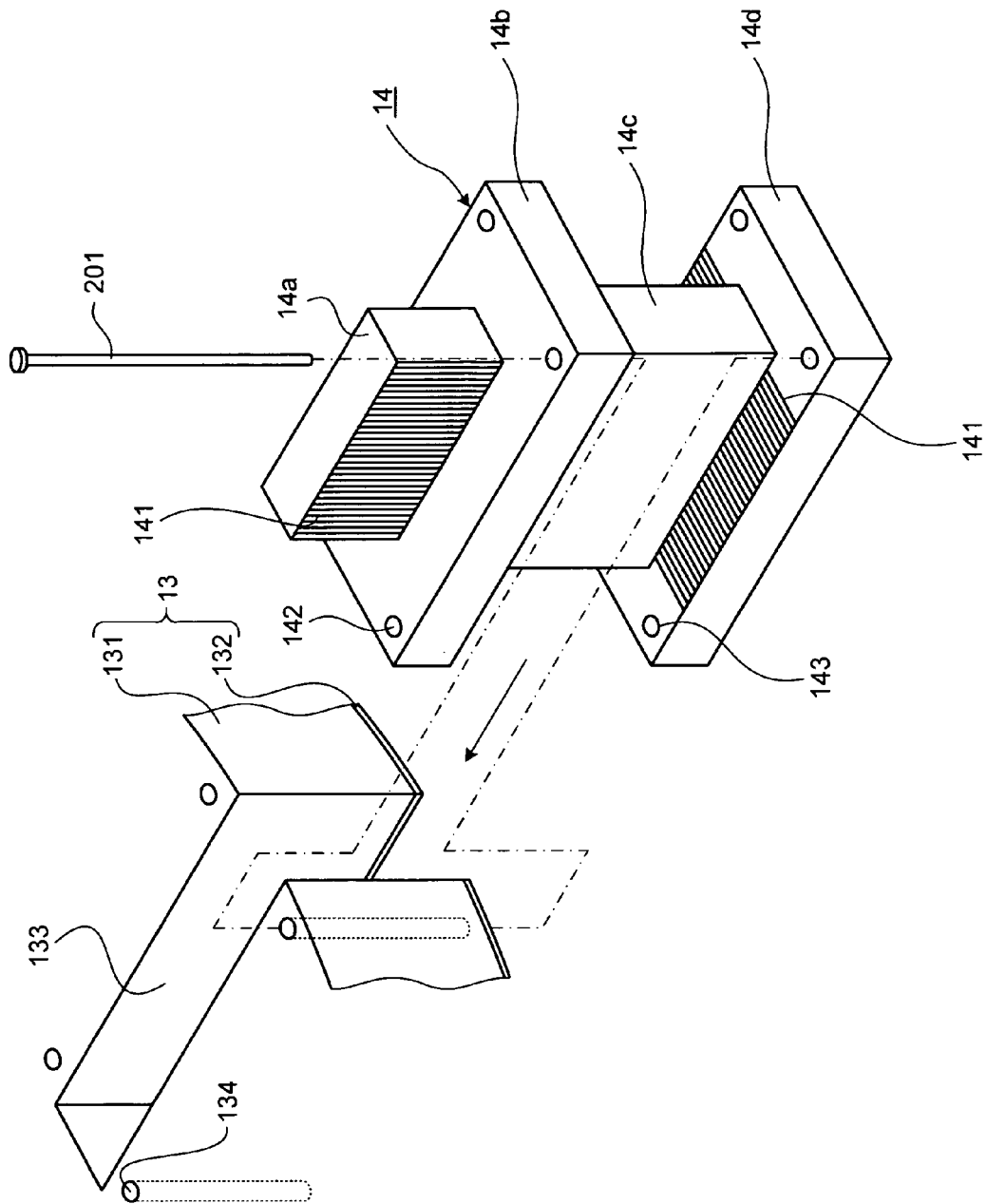
FIG. 11 is a diagram of a configuration of a ZIF-type connector included in the probe card according to the second embodiment of the present invention.

FIG. 11 is a diagram of a general configuration of the connector 14. In FIG. 11, similarly to FIG. 8, the four thin-film wiring sheets 132a, 132b, 132c, 132d are collectively denoted by the reference symbol 132. Hereinafter, in the second embodiment, the four thin-film wiring sheets 132a, 132b, 132c, 132d are collectively referred to as the thin-film wiring sheet 132. The connector 14 is a zero insertion force (ZIF) type connector that requires almost no external force for attachment and detachment of connectors that form a pair. More specifically, the connector 14 is a male connector to be attached to a cutout part 133 formed on the wiring substrate 13, and includes a joint portion 14a which has a plurality of lead wires 141 exposed on the side surface thereof and is combined with a female connector (mounted on the test apparatus side) that forms a pair, a first flange portion 14b which is formed on a base end portion of the joint portion 14a and is placed on one surface (the top surface in FIG. 11) of the wiring substrate 13 when attached to the wiring substrate 13, a body portion 14c which is inserted into the inside of the cutout part 133, and a second flange portion 14d which has the plurality of lead wires 141 exposed on the surface thereof on the body portion 14c side. The plurality of lead wires 141 of the second flange portion 14d is brought into contact with wiring on the thin-film wiring sheet 132, so that the connector 14 and the thin-film wiring sheet 132 are electrically connected to each other.

The surfaces of the first flange portion 14b and the second flange portion 14d opposing each other have substantially the same areas. On the first flange portion 14b is formed a plurality of hole portions 142. On the second flange portion 14d is formed a plurality of hole portions 143 which is coaxially positioned with respect to any one of the plurality of hole portions 142 formed on the first flange portion 14b and which allows insertion of screws.

When the connector 14 is attached to the wiring substrate 13, as illustrated in FIG. 11, the connector 14 is slid to be plugged from the outer periphery side of the cutout part 133 of the wiring substrate 13 toward the center of the wiring substrate 13, and then screws 201 are attached to respective sets of hole portions 134, 142, and 143. In FIG. 11, only a single screw 201 is illustrated for simplicity.

According to the second embodiment described above, because a ceramic substrate having the coefficient of thermal expansion of $3.0 \times 10^{-6}$ to $5.0 \times 10^{-6}/°$ C. and a plurality of thin-film wiring sheets stacked on one surface of the ceramic substrate are included, it is possible to provide a wiring substrate that allows wiring at a fine pitch and has a coefficient of thermal expansion close to the coefficient of thermal expansion of silicone, and a probe card that includes the wiring substrate.

Furthermore, according to the second embodiment, because a space transformer and an interposer are not needed, it is possible to provide a probe card that has excellent transmission characteristics for a high-frequency electrical signal, requires less cost, and is cost-effective.

Moreover, according to the second embodiment, because an electrical connection is established by applying a ZIF-type connector, it is possible to surely obtain the electrical connection without causing any stress even when the number of probes is large and stress on the probe card or a tester may be increased due to enormous reflection force that occurs on a spring-action terminal. Therefore, even in the probe card having a large number of probes and complicated wiring, electrical connection failure or damage on the probes is less likely to occur, resulting in improved durability of the probe card.

Third Embodiment

Figure 12:
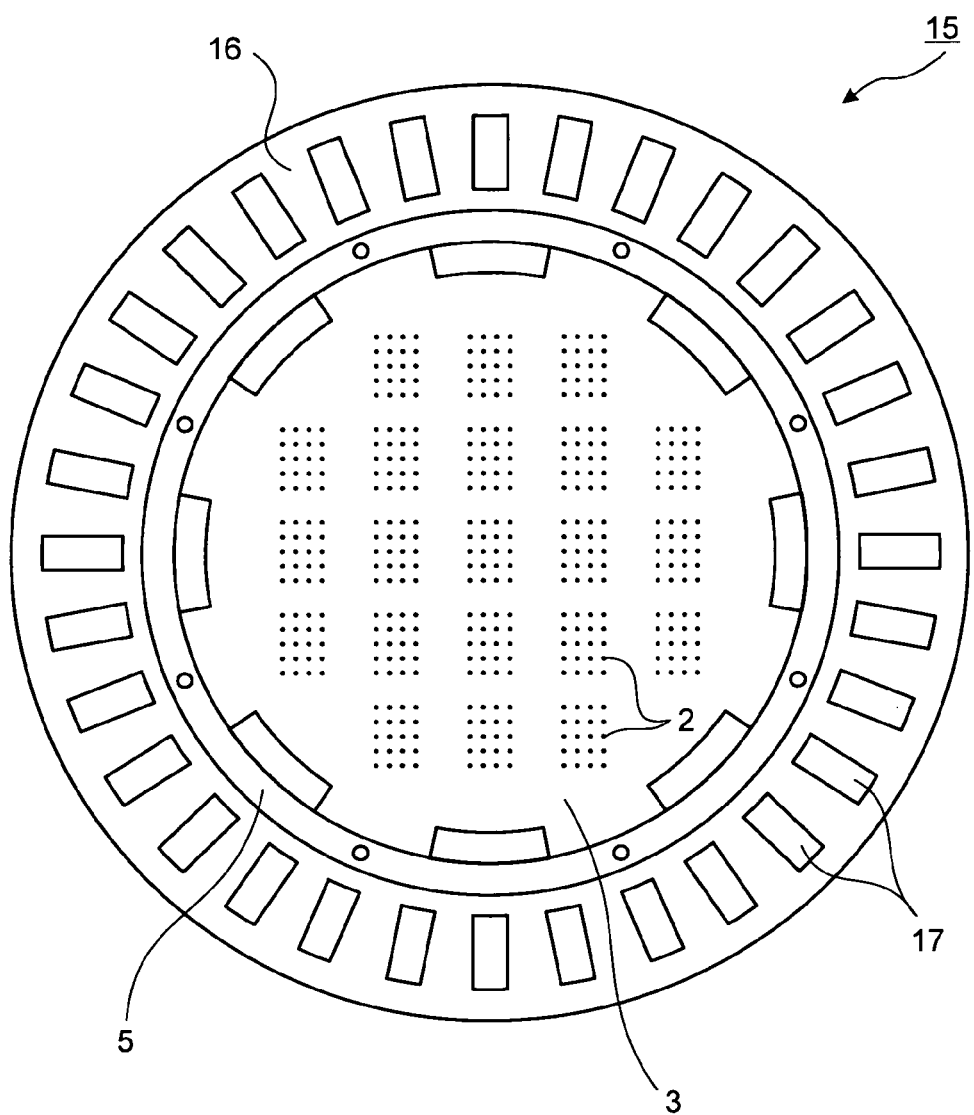
FIG. 12 is a plan view of a configuration of a probe card according to a third embodiment of the present invention.

FIG. 12 is a plan view of a configuration of a probe card according to a third embodiment of the present invention. A probe card 15 illustrated in the figure includes the plurality of probes 2, the probe head 3, a wiring substrate 16, the leaf spring 5, and a plurality of connectors 17 which are radially arranged with respect to the center of the wiring substrate 16.

Figure 13:
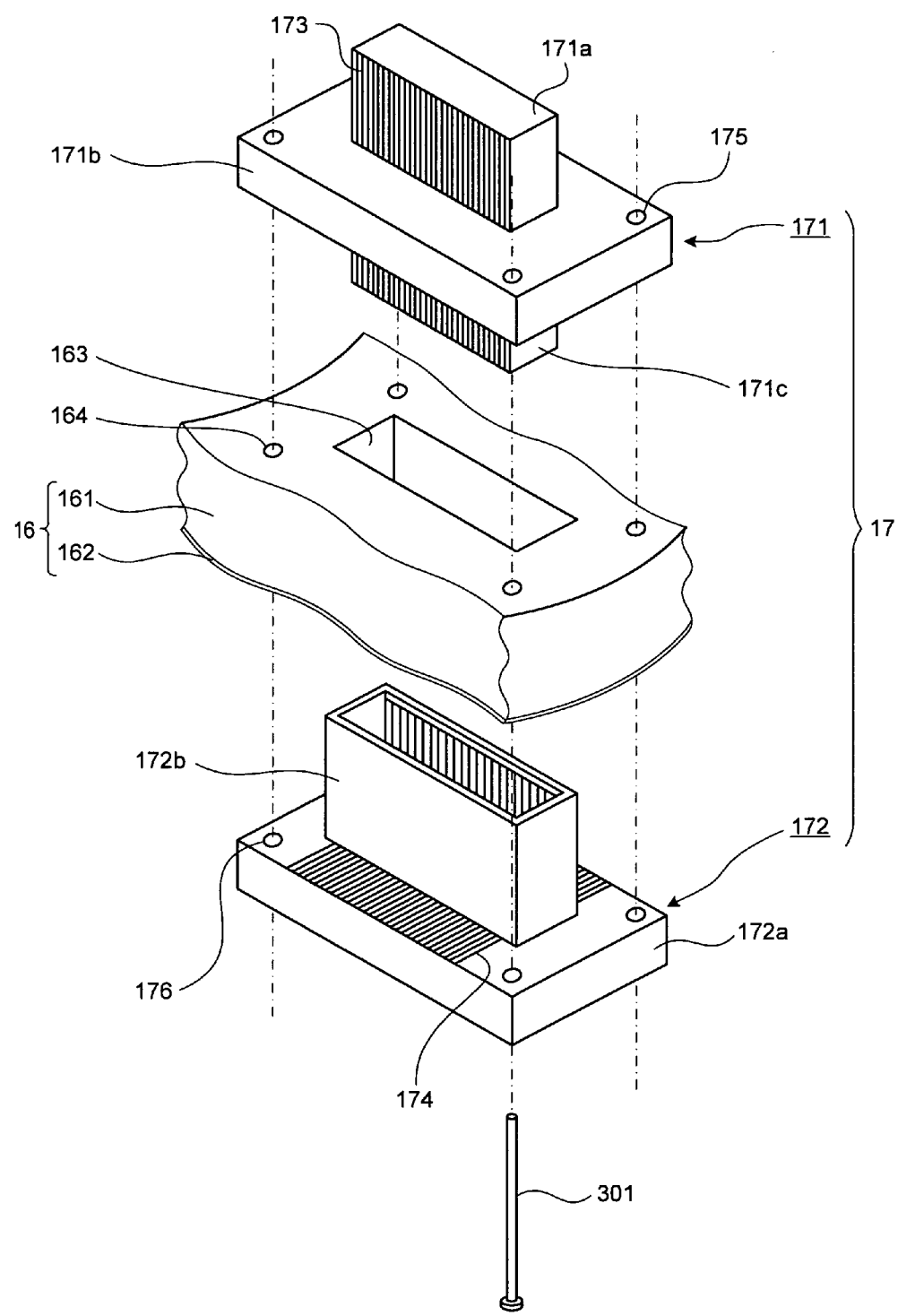
FIG. 13 is a diagram of a configuration of a ZIF-type connector included in the probe card according to the third embodiment of the present invention.

The wiring substrate 16 includes a ceramic substrate 161 made of the same material as the ceramic substrate 41 described above (with the coefficient of thermal expansion of $3.0 \times 10^{-6}$ to $5.0 \times 10^{-6}/°$ C.), and a plurality of thin-film wiring sheets which are fixedly stacked on one surface of the ceramic substrate 161 on a side opposing the probe head 3. In FIG. 13, the plurality of thin-film wiring sheets are collectively denoted by a reference symbol 162. Hereinafter, in the third embodiment, the plurality of thin-film wiring sheets is collectively referred to as the thin-film wiring sheet 162.

FIG. 13 is a diagram of a general configuration of the connector 17. The connector 17 illustrated in the figure is a ZIF-type male connector and is constructed by combining a first connector 171 which is combinable with a female connector that forms a pair, and a second connector 172 which is attached to an opening portion 163 formed on the wiring substrate 16, which is electrically connected with the thin-film wiring sheet 162 of the wiring substrate 16, and which is combinable with the first connector 171.

The first connector 171 includes a first joint portion 171a which has a convex shape and is mounted to be combined with the female connector that forms a pair, a third flange portion 171b which is placed on one surface (the top surface in FIG. 13) of the wiring substrate 16 when attached to the wiring substrate 16, and a second joint portion 171c which has a convex shape and is combined with the second connector 172. On each side surface of the first joint portion 171a and the second joint portion 171c, a plurality of lead wires 173 are exposed. The second connector 172 includes a fourth flange portion 172a which is placed on the other surface (the bottom surface in FIG. 13) of the wiring substrate 16 when attached to the wiring substrate 16, and an engagement portion 172b which has a concave shape and with which the second joint portion 171c of the first connector 171 is engaged to be combined. On the top surface of the fourth flange portion 172a and the inner side surface of the engagement portion 172b, a plurality of lead wires 174 are exposed. The lead wires 174 exposed on the top surface of the fourth flange portion 172a are brought into contact with wiring on the thin-film wiring sheet 162, so that the second connector 172 and the thin-film wiring sheet 162 are electrically connected to each other. Furthermore, the lead wires 174 exposed on the inner side surface of the engagement portion 172b are brought into contact with the lead wires 173 of the first connector 171, so that the first connector 171 and the second connector 172 are electrically connected to each other.

When the connector 17 is attached to the wiring substrate 16, the engagement portion 172b of the second connector 172 is mounted on the opening portion 163, and thereafter, the second joint portion 171c of the first connector 171 is engaged with the engagement portion 172b and screws 301 are attached to hole portions 175 formed on the first connector 171, hole portions 164 formed on the wiring substrate 16, and hole portions 176 formed on the second connector 172 (in FIG. 13, only a single screw 301 is illustrated for simplicity).

According to the third embodiment described above, it is possible to achieve the same advantages as those of the second embodiment described above. In addition, according to the third embodiment, a male connector is constructed of separated two connectors, so that only an opening portion needs to be formed on the wiring substrate instead of forming the cutout part on the wiring substrate as in the second embodiment described above. Therefore, it is possible to increase the rigidity of the wiring substrate. Furthermore, because connection of a ground layer or a power layer of the wiring substrate can be maintained without disconnection at the outer peripheral portion of the wiring substrate, it is possible to ensure a path of a return current. Therefore, it is possible to achieve desirable transmission characteristics for transmitting a high-frequency electrical signal.

Other Embodiments

Figure 14:
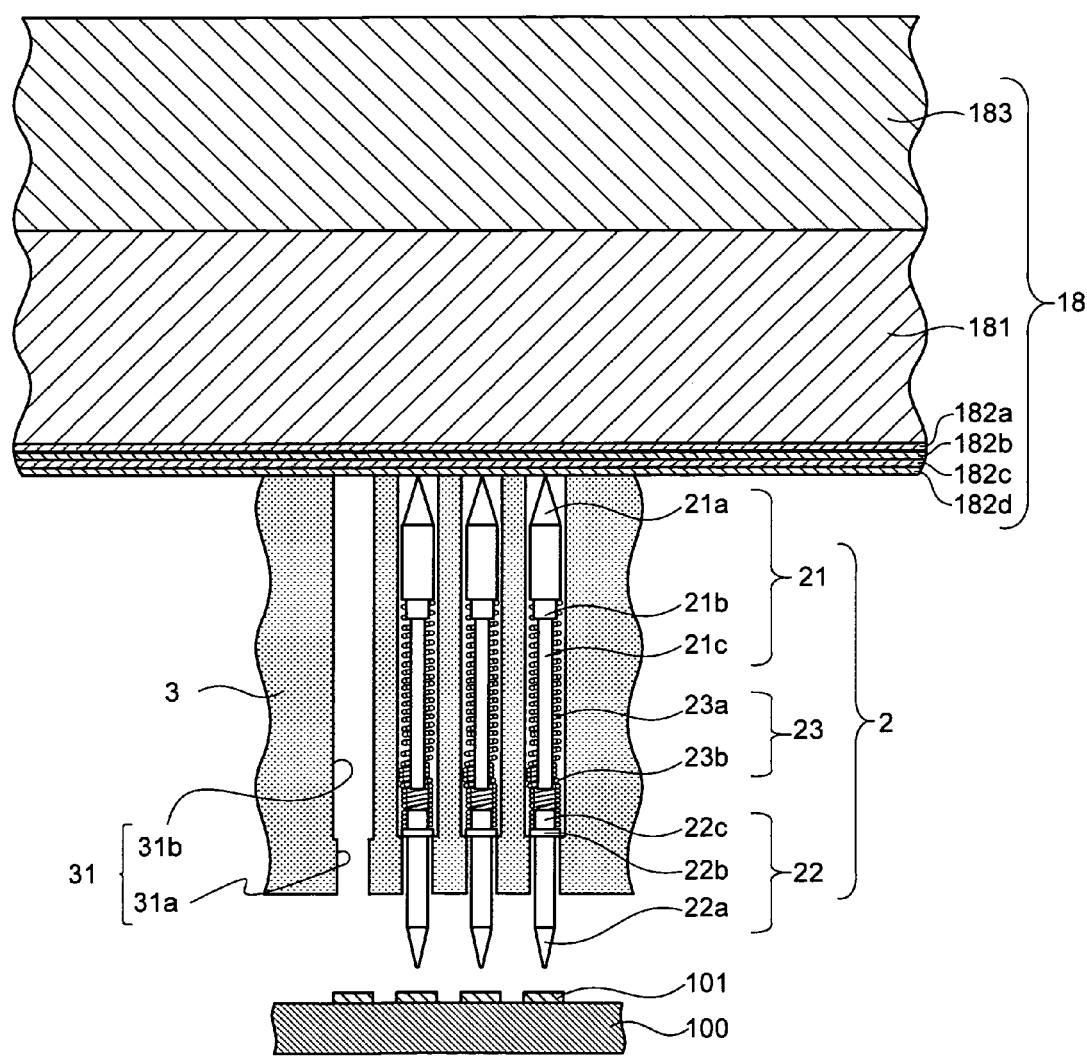
FIG. 14 is a diagram of a configuration of a relevant portion of a wiring substrate according to another embodiment of the present invention.

The first to third embodiments are explained in detail above as best modes for carrying out the present invention; however, the present invention should not be limited to the embodiments. For example, depending on the coefficient of thermal expansion of the ceramic substrate, as in a wiring substrate 18 illustrated in FIG. 14, it is possible to stack a metal 183 having a small coefficient of thermal expansion on a surface (other surface) different from the surface where four thin-film wiring sheets 182a, 182b, 182c, 182d are stacked among the surfaces of a ceramic substrate 181, and join the ceramic substrate 181 and the metal 183 together by diffusion bonding. The "metal" described here includes alloy. With the wiring substrate 18 as described above, even when the ceramic substrate 181 has the coefficient of thermal expansion substantially equal to that of a conventional ceramic substrate, it is possible to make the coefficient of thermal expansion of the wiring substrate 18 close to the coefficient of thermal expansion of silicone by combining the metal 183 having an appropriate coefficient of thermal expansion. In this regard, as the ceramic substrate 181, Macerite (registered trademark) HSP (with the coefficient of thermal expansion of $9.8 \times 10^{-6}/°$ C.), Photoveel (registered trademark) H (with the coefficient of thermal expansion of $7.8 \times 10^{-6}/°$ C.), or Photoveel (registered trademark) II (with the coefficient of thermal expansion of $1.4 \times 10^{-6}/°$ C.) may be applied.

Figure 15:
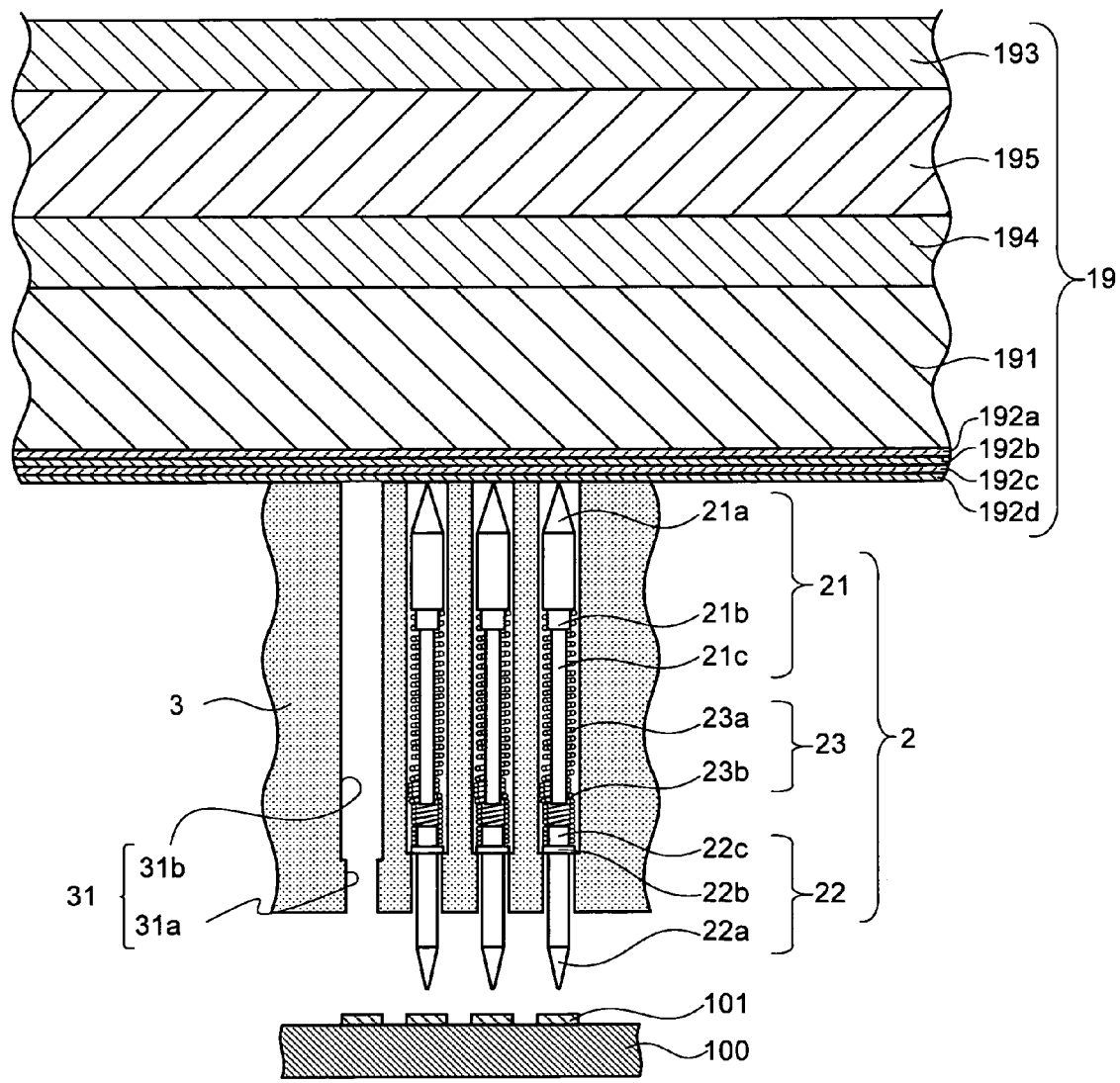
FIG. 15 is a diagram of a configuration of a relevant portion of a wiring substrate according to still another embodiment of the present invention.
Figure 16:
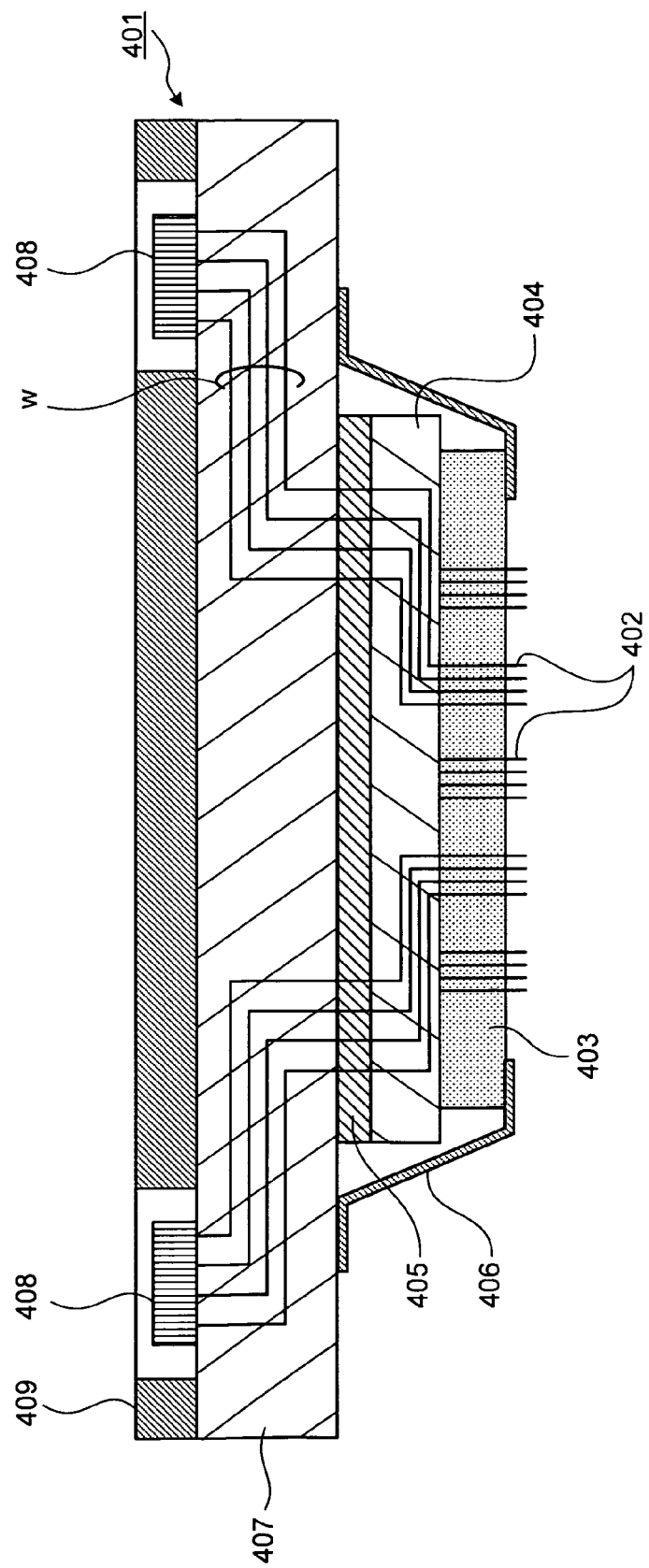
FIG. 16 is a diagram of a configuration of a conventional probe card.

Furthermore, as illustrated in FIG. 15, it is possible to stack metals having different coefficients of thermal expansion on a ceramic substrate. A wiring substrate 19 illustrated in FIG. 15 is an example in which three metals are stacked on a surface different from the surface where four thin-film wiring sheets 192a, 192b, 192c, 192d are stacked among the surfaces of a ceramic substrate 191, and are firmly fixed by diffusion bonding. For example, it is possible to apply Kovar (registered trademark) material to a metal 193 on the topmost side in FIG. 15 and a metal 194 directly stacked on the ceramic substrate 191, and apply invar material having the coefficient of thermal expansion smaller than that of the Kovar (registered trademark) material to a metal 195 stacked between the two Kovar (registered trademark) materials. In this manner, by stacking a plurality of metal plates having different coefficients of thermal expansion on the ceramic substrate, it is possible to make the coefficient of thermal expansion of the whole wiring substrate close to the coefficient of thermal expansion of silicone.

In the second and third embodiments described above, an example is explained in which a ZIF-type male connector is mounted on the wiring substrate. However, it is possible to mount a ZIF-type female connector on the wiring substrate.

As is apparent in the above description, the present invention can include various embodiments and the like not described here, and various design changes and the like can be made in the range without departing from the technical idea as specified by the claims.

INDUSTRIAL APPLICABILITY

As described above, the wiring substrate and the probe card according to the present invention is useful for an electrical characteristics test for a semiconductor wafer.

The invention claimed is:

1. A probe card that electrically connects a semiconductor wafer and a circuit structure that generates a signal to be output to the semiconductor wafer, by using a conductive probe that is extendable in a longitudinal direction, the probe card comprising:
    a wiring substrate comprising a ceramic substrate having a coefficient of thermal expansion of $3.0 \times 10^{-6}$ to $5.0 \times 10^{-6}/°C.$;
    one or more thin-film wiring sheets stacked on a first surface of the ceramic substrate by an adhesive layer,
    a thin film multilayer wiring sheet disposed on a second surface of the ceramic substrate opposite the first surface by an adhesive layer,
    a reinforcing substrate disposed atop the thin film multilayer wiring sheet and substantially along an entire surface area thereof; and
    a probe head on which a plurality of probes is arranged in accordance with wiring on the thin-film wiring sheet, which holds individual probes while preventing the probes from coming off and allowing both ends of each probe to be exposed, and which is stacked on the wiring substrate while allowing one end of each probe to be brought into contact with the thin-film wiring sheet,
    wherein, the probe card does not include a space transformer.

2. The wiring substrate according to claim 1, wherein the ceramic substrate has a through hole that pierces through the ceramic substrate in a thickness direction.

3. The wiring substrate according to claim 1, further comprising:
    a plurality of zero insertion force type connectors, each of which is electrically connected to the thin-film wiring sheet.

4. The probe card according to claim 1, further comprising:
    a mounted component disposed atop the thin film multilayer wiring sheet.

* * * * *